(12) United States Patent
Kaneko et al.

(10) Patent No.: US 7,663,307 B2
(45) Date of Patent: Feb. 16, 2010

(54) LIGHT-EMITTING DEVICE

(75) Inventors: Kei Kaneko, Odawara (JP); Naomi Shida, Tokyo (JP); Masahiro Yamamoto, Kawasaki (JP); Yasushi Hattori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 408 days.

(21) Appl. No.: 11/355,886

(22) Filed: Feb. 17, 2006

(65) Prior Publication Data
US 2007/0013304 A1 Jan. 18, 2007

(30) Foreign Application Priority Data
Jul. 15, 2005 (JP) .............................. 2005-207673

(51) Int. Cl.
*H01J 1/62* (2006.01)
*H01J 63/04* (2006.01)

(52) U.S. Cl. ............... 313/506; 313/498; 313/483; 313/512; 313/501; 257/98; 257/99; 257/103

(58) Field of Classification Search ......... 313/498–512; 257/98, 99, 103
See application file for complete search history.

(56) References Cited

U.S. PATENT DOCUMENTS

| | | | |
|---|---|---|---|
| 5,998,925 A * | 12/1999 | Shimizu et al. ............. | 313/503 |
| 6,953,952 B2 * | 10/2005 | Asakawa ..................... | 257/103 |
| 7,205,168 B2 * | 4/2007 | Oohata et al. ................ | 438/22 |
| 2002/0117677 A1 * | 8/2002 | Okuyama et al. ............. | 257/94 |
| 2005/0121688 A1 * | 6/2005 | Nagai et al. .................. | 257/99 |

FOREIGN PATENT DOCUMENTS

JP 7-99345 4/1995

(Continued)

OTHER PUBLICATIONS

U.S. Appl. No. 11/348,410, filed Feb. 7, 2006, Kei Kaneko, et al.

(Continued)

*Primary Examiner*—Toan Ton
*Assistant Examiner*—Zachary Snyder
(74) *Attorney, Agent, or Firm*—Oblon, Spivak, McClelland, Maier & Neustadt, L.L.P.

(57) ABSTRACT

A light-emitting device is provided, which includes a supporting member, a light-emitting element disposed on the supporting member to emit a light, the light-emitting element having a semiconductor substrate and a polygonal top surface, an electrode pad formed on the top surface of the light-emitting element, a first lead electrode formed on the supporting member, a conductive wire connecting the electrode pad with the first lead electrode, the conductive wire being arranged to pass over one of corners of the polygonal top surface of the light-emitting element and along a ridge formed contiguous to the one of corners and corresponding to a boundary between neighboring side surfaces of the light-emitting element, and a fluorescent layer containing a light-transmitting member and a fluorescent substance.

20 Claims, 3 Drawing Sheets

FOREIGN PATENT DOCUMENTS

| | | |
|---|---|---|
| JP | 10-150224 | 6/1998 |
| JP | 10-209496 | 8/1998 |
| JP | 2000-150966 | 5/2000 |
| JP | 2004-186278 | 7/2004 |
| JP | 2004-274040 | 9/2004 |
| JP | 2005-191420 | 7/2005 |

OTHER PUBLICATIONS

U.S. Appl. No. 11/561,670, filed Nov. 20, 2006, Yamamoto, et al.
U.S. Appl. No. 11/287,236, filed Nov. 28, 2005, Hattori et al.
U.S. Appl. No. 11/668,218, filed Jan 29, 2007, Hattori, et al.
U.S. Appl. No. 11/689,246, filed Mar. 21, 2007, Hattori, et al.

* cited by examiner

LIGHT-EMITTING DEVICE

CROSS-REFERENCE TO RELATED APPLICATIONS

This application is based upon and claims the benefit of priority from prior Japanese Patent Application No. 2005-207673, filed Jul. 15, 2005, the entire contents of which are incorporated herein by reference.

BACKGROUND OF THE INVENTION

1. Field of the Invention

This invention relates to a light-emitting device, and in particular, to a light-emitting device having an LED (light-emitting diode) chip where a semiconductor substrate is employed.

2. Description of the Related Art

A light-emitting device comprising a combination of a semiconductor light-emitting element and a fluorescent substance (phosphor) is utilized in various fields as an illumination source, as a backlight source for liquid crystal, etc. A light-emitting device of this kind is manufactured by a process wherein a fluorescent substance is incorporated, at first, in a material for a light-transmitting member such as silicone resin or glass, and the resultant material is then dropped, by using a dispenser, into a recess where a light-emitting element is mounted, the material in the recess being subsequently thermally cured.

In the LED chip where a semiconductor substrate such as a SiC substrate or GaN substrate is employed, the positive electrode and the negative electrode are provided on a top surface and a bottom surface, respectively, of the LED chip. Further, in this LED chip where a semiconductor substrate is employed, a sidewall portion of the substrate is obliquely cut out so as to improve the light extraction efficiency. As a result, it is possible to obtain the emission of light not only from the top surface of the chip but also from the obliquely worked sidewall thereof. In this structure however, part of the chip is exposed without being covered, resulting in the generation of color drift.

Since the fluorescent substance becomes higher in light conversion efficiency as the particle diameter becomes larger, it is desirable to coat the LED chip with a fluorescent layer containing a fluorescent substance of larger diameter at a high concentration. On the occasion of coating the LED chip with a resin containing a fluorescent substance, the resin tends to be attracted by a conductive wire, so that it is impossible to form a fluorescent layer which is uniform in thickness around the LED chip. Further, since a fluorescent substance of larger diameter is more liable to sediment, it is difficult to enable the fluorescent substance to enter below the conductive wire, thus making the density of fluorescent substance non-uniform in the fluorescent layer. A fluorescent layer which is non-uniform in thickness as well as a high density distribution of fluorescent substance would become a cause for generating discoloration.

BRIEF SUMMARY OF THE INVENTION

A light-emitting device according to one aspect of the present invention comprises a supporting member; a light-emitting element disposed on the supporting member to emit a light, the light-emitting element having a semiconductor substrate and a polygonal top surface; an electrode pad formed on the top surface of the light-emitting element; a first lead electrode formed on the supporting member; a conductive wire connecting the electrode pad with the first lead electrode, the conductive wire being arranged to pass over one of corners of the polygonal top surface of the light-emitting element and along a ridge formed contiguous to the one of corners and corresponding to a boundary between neighboring side surfaces of the light-emitting element; and a fluorescent layer containing a light-transmitting member and a fluorescent substance.

A light-emitting device according to another aspect of the present invention comprises a supporting member; a light-emitting element disposed on the supporting member to emit a light, the light-emitting element comprising a semiconductor substrate and having a configuration including a top surface and a bottom surface and at least three oblique side surfaces; an electrode pad formed on a top surface of the light-emitting element; a first lead electrode formed on the supporting member; a conductive wire connecting the electrode pad with the first lead electrode, the conductive wire being arranged to pass over one of corners of the polygonal top surface of the light-emitting element and along a ridge formed contiguous to the one of corners and corresponding to a boundary between neighboring side surfaces of the light-emitting element; and a fluorescent layer containing a light-transmitting member and a fluorescent substance.

DETAILED DESCRIPTION OF THE INVENTION

Next, one embodiment of the present invention will be explained with reference to drawings.

Figure 1:
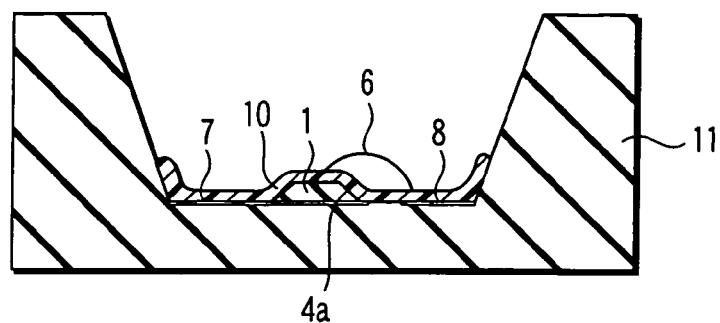
FIG. 1 is a cross-sectional view showing one example of the light-emitting device according to one embodiment of the present invention.

FIG. 1 is a cross-sectional view showing one example of the light-emitting device according to one embodiment of the present invention.

In the light-emitting device shown in FIG. 1, an LED chip 1 as a light-emitting element is disposed on a lead electrode 7 formed on the bottom of a package cup 11 employed as a supporting member. For example, it is possible to use a vessel as a supporting member. Alternatively, a structure having a light-emitting element or a reflector formed on a substrate can be used as the supporting member. An electrode pad (not shown herein, but is indicated as a reference number 5 in FIG. 2) formed on a top surface of the LED chip 1 is connected with a lead wire 8 formed on the bottom of the package cup 11. In the light-emitting device shown in FIG. 1, a fluorescent layer 10 is disposed covering the top surface of the LED chip 1 as well as the bottom of the package cup 11.

Figure 2:
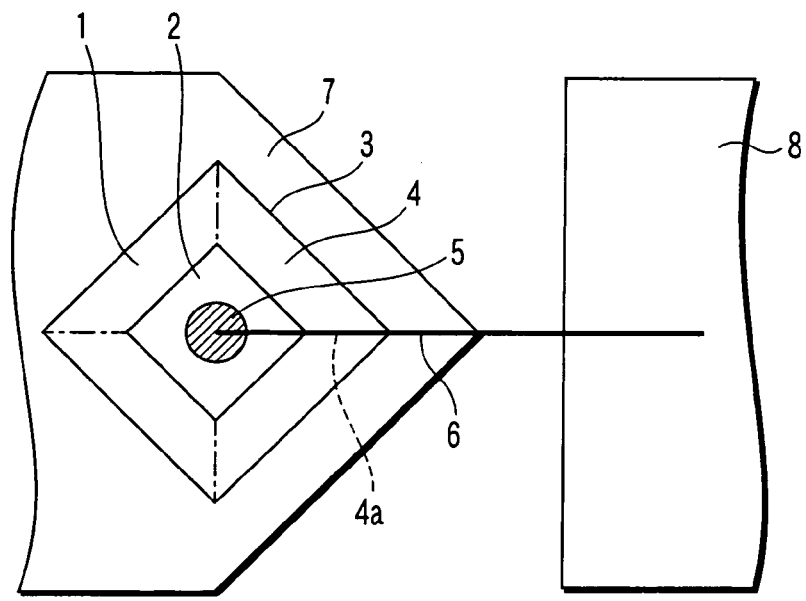
FIG. 2 is a plan view schematically illustrating a top surface of part of the light-emitting device according to one embodiment of the present invention.

FIG. 2 shows the top surface of part of the light-emitting device shown in FIG. 1. As shown in FIG. 2, the light-emitting chip 1 having a rectangular top surface 2 is mounted, through the bottom 3 thereof, on the lead electrode 7, and the electrode pad 5 is formed at a central region of the top surface 2 of the light-emitting chip 1. Incidentally, the central region herein means a region with the center thereof approximately coinciding with the center of gravity of the top surface 2 of the chip as shown in FIG. 2. The electrode pad 5 is electrically connected with the lead electrode 8 by a conductive wire 6, which is disposed along a ridge 4a elevationally defining a boundary between neighboring sidewalls of the light-emitting chip 1 without laterally crossing a sidewall 4 of the light-emitting chip 1.

As for the LED chip 1, it is possible to employ a chip which is capable of emitting a light of wavelength which capable of exciting a fluorescent substance. In this embodiment of the present invention, an LED chip made of a nitride semiconductor which has been grown on a SiC substrate is employed. As for the thickness of the LED chip 1, it can be optionally determined depending on the kinds of light-emitting device, etc.

If a white light is to be emitted, the emission wavelength of the light-emitting chip (LED chip) 1 should preferably be set to the range of 400 nm to 550 nm, more preferably to the range of 420 nm to 490 nm while taking into consideration additive complementary colors between the emission wavelength of the light-emitting chip and the emission wavelength to be derived from the fluorescent substance. Depending on the kinds of fluorescent substance, it is possible to employ an LED chip which is capable of emitting a light of ultraviolet region of not more than 400 nm in wavelength. If an LED chip which is capable of emitting a light of ultraviolet region is employed, various kinds of fluorescent substances which are capable of emitting red color, yellow color, green color, blue color, etc. by the effects of light of ultraviolet region may be suitably combined with each other so as to enable a white light to emit through the mixing of these colors. As for the fluorescent substances which are capable of emitting red color, yellow color, green color, blue color, etc., it is possible to employ the fluorescent substances to be discussed hereinafter. Incidentally, as for the fluorescent substance which is capable of emitting blue light by the effects of light of ultraviolet region, it is possible, for example, $(Sr, Ca)_{10}(PO_4)_6Cl_2$: $Eu^{2+}$, $BaMg_2Al_{15}O_{27}$:$Eu^{2+}$, etc.

The configuration of the top surface of LED chip 1 should be polygonal, i.e., at least triangular, and the sidewalls of LED chip 1 should preferably be obliquely worked so as to enable the sidewalls thereof to point upward. In this case, the LED chip is considered to have at least three sidewalls which are inclined like those of truncated pyramid. An LED chip having a rectangular configuration for instance can be manufactured by a process wherein a scribing line is formed at first on a semiconductor wafer having electrodes, etc. formed in advance and then the semiconductor wafer is split into individual LED chips by an external force. With respect to an LED chip other than a rectangular configuration, it can be manufactured in the same manner as described above. If it is impossible to split the semiconductor wafer by an external force, the LED chips can be manufactured by using a chlorine-based dry etching method. Alternatively, $SiO_2$ may be vapor-deposited, through a hexagonal photomask, on a SiC substrate or a nitride semiconductor thin film, thereby forming a hexagonal pyramid-like crystal.

As for the conductive wire 6 for connecting the electrode pad 5 of the LED chip 1 with the lead electrode 8, it is desirable to employ those excellent in ohmic property with electrode pad, in mechanical connectability, electric conductivity and thermal conductivity. More specifically, it is desirable to employ a conductive wire made of metal such as gold, copper, platinum, aluminum, etc. or an alloy thereof. In this embodiment, a conductive wire made of gold is employed. Incidentally, irrespective of the configuration of LED chip 1 and the material of the wire, the diameter of the conductive wire 6 should preferably be confined within the range of 10 to 45 μm. If the diameter of the conductive wire 6 is less than 10 μm, the mechanical strength thereof would be deteriorated. On the other hand, if the diameter of the conductive wire 6 exceeds 45 μm, the light from the LED chip may be shielded. The conductive wire of this kind can be used for connecting the electrode pad of LED chip with the lead electrode by using a wire bonding machine.

In the light-emitting device shown in FIG. 1, a fluorescent layer 10 is disposed so as to cover the top surface and sidewalls of the LED chip 1 as well as the bottom of the package cup 11.

The fluorescent layer 10 is constituted by a light-transmitting member containing a fluorescent substance dispersed therein. As for the light-transmitting member, it is possible to employ, for example, various kinds of resins such as silicone resin and epoxy resin. Under some circumstances, an insulating adhesive (for example, a light-transmitting inorganic material such as glass) to be employed for fixing an LED chip to the package cup may be employed as a light-transmitting member. The fluorescent substance should preferably be dispersed in the light-transmitting member at a concentration ranging from 40 to 60 wt %, more preferably from 50 to 60 wt %. If the concentration of the fluorescent substance is less than 40 wt %, the blue-emitting portion may become too strong so that it would become difficult to obtain a white light. On the other hand, if the concentration of the fluorescent substance exceeds 60 wt %, the emission of light may be shielded by the fluorescent substance.

The fluorescent layer 10 should preferably be formed so as to have a uniform film thickness ranging from 80 to 240 μm and to cover not only the top surface and sidewalls of the LED chip 1 but also the bottom of the package cup 11. When the film thickness of the fluorescent layer 10 is confined within this range, it would become possible to utilize the light conversion efficiency of the fluorescent substance to a maximum extent. If the film thickness of fluorescent layer 10 is less than 80 μm, it would be impossible to secure a high light conversion efficiency. On the other hand, if the film thickness of fluorescent layer 10 exceeds 240 μm, the light extraction efficiency may be deteriorated. More preferably, the film thickness of fluorescent layer 10 should be confined to the range of 100 to 150 μm.

Especially, when the concentration of the fluorescent substance in the fluorescent layer 10 is confined to range from 40 to 60 wt %, fine recessed/projected portions reflecting the configuration of fluorescent substance would be formed on the surface of fluorescent layer 10. As a result, the light is enabled to effectively diffuse into the interface between the fluorescent layer and the external atmosphere, thereby making it possible to prevent the discoloration of luminescent color. The fluorescent layer 10 having the same degree of film thickness as described above may extend over the sidewalls of package cup 11 as shown in FIG. 1 if the altitude of the distal end of the fluorescent layer 10 is limited to about 500 μm in height as measured from the bottom of the package cup 11.

As for the fluorescent substance to be dispersed in the fluorescent layer 10, it is possible to employ various kinds of fluorescent substances which are capable of emitting light as they are excited by the light emitted from a semiconductor LED chip where a nitride semiconductor is employed as a light-emitting layer. When a blue LED chip and a yellow fluorescent substance are employed in combination, it would be possible to obtain a white light. This yellow fluorescent substance may be mixed with a red fluorescent substance or a yellowish green fluorescent substance, thus making it possible to enhance the color rendering.

As for the fluorescent substance that can be employed in the embodiment of the present invention, following fluorescent substances can be employed.

As for the fluorescent substance which is capable of emitting yellow color, it is possible to employ an yttrium aluminum garnet oxide fluorescent substance (YAG fluorescent substance) containing Y and activated by Ce or Pr, and a silicate fluorescent substance such as an europium-activated alkaline earth metal silicate-based fluorescent substance represented by $(Ba, Ca, Sr)_2SiO_4$:Eu.

As for the fluorescent substance which is capable of emitting red color, it is possible to employ a silicate fluorescent substance such as an europium-activated alkaline earth metal silicate-based fluorescent substance represented by $(Ba, Ca, Sr)_2SiO_4$:Eu. When part of Sr is substituted by Ba, the emission spectrum can be shifted to short wavelength side, and when part of Sr is substituted by Ca, the emission spectrum can be shifted to long wavelength side. By modifying the composition in this manner, it is possible to continuously adjust the luminescent color. Further, it is also possible to employ a nitride fluorescent substance containing N, at least one element selected from Be, Mg, Ca, Sr, Ba and Zn, at least one element selected from C, Si, Ge, Sn, Ti, Zr and Hf, and activated with at least one element selected from rare earth elements. Additionally, it is also possible to employ an europium-activated alkaline earth silicon nitride-based fluorescent substance constituted by ruptured particles having red ruptured surfaces, capable of emitting a light of red region and represented by $(Mg, Ca, Sr, Ba)_2Si_5N_8$:Eu, and an europium-activated alkaline earth oxychalcogenite-based fluorescent substance constituted by grown particles having approximately spherical configuration as a regular crystal growth configuration, capable of emitting a light of red region and represented by $(Y, La, Gd, Lu)_2O_2S$:Eu.

As for the fluorescent substance which is capable of emitting green color, it is possible to employ an europium-activated alkaline earth silicon oxynitride-based fluorescent substance constituted by ruptured particles having ruptured surfaces, capable of emitting a light of green region and represented by $(Mg, Ca, Sr, Ba)Si_2O_2N_2$:Eu, and an europium-activated alkaline earth magnesium silicate-based fluorescent substance constituted by ruptured particles having ruptured surfaces, capable of emitting a light of green region and represented by $(Mg, Ca, Sr, Ba)_2SiO_4$:Eu.

The aforementioned fluorescent substances can be employed singly or in combination of two or more kinds. Further, it is possible to obtain an optional color tone through a combination of these fluorescent substances with a light-emitting chip. For example, it is possible to obtain a light-emitting device which is capable of emitting white light through a combination of a semiconductor light-emitting element capable of emitting blue color with a yellow fluorescent substance. When this yellow fluorescent substance is replaced by a mixture of a yellow fluorescent substance and a red fluorescent substance in this case, it is possible to obtain a white light of warm color.

When two or more kinds of fluorescent substances are suitably mixed, a light of desired white type color mixture can be obtained. Specifically, when the quantities of plural kinds of fluorescent substances differing in chromaticity points are suitably adjusted in conformity with the emission wavelength of light-emitting chip and incorporated in a light-emitting device, it is possible to enable the light-emitting device to emit at an optional point on a chromaticity diagram that lies on a junction between these fluorescent substances and the light-emitting chip.

In view of the excitation intensity to be effected by a blue light source, it is more preferable to employ, as a yellow fluorescent substance, a silicate compound based on a composition of $(Sr, Ca, Ba)_2SiO_4$:Eu among the aforementioned fluorescent substances. It is also possible to create white light even if other kinds of yellow fluorescent substances such as an yttrium aluminum oxide fluorescent substance, YAG:Ce or sulfide fluorescent substance are employed.

In order to enhance the light conversion efficiency, the particle diameter of fluorescent substance should preferably be set to the range of 20 to 75 µm, more preferably 20 to 45 µm. The range of 20 to 75 µm in particle diameter in this case means that the particle diameter of fluorescent particles occupying not less than 1/3 of a total number of fluorescent particles existing in an area of 0.04 $mm^2$ is distributed within the range of 20 to 75 µm as a fluorescent layer is observed by using a microscope.

In the light-emitting device of this embodiment of the present invention, a conductive wire connecting the electrode pad with the first lead electrode is arranged to pass over one of corners of the polygonal top surface of the light-emitting chip and along a ridge formed contiguous with the one of corners and elevationally defining a boundary between neighboring sidewalls of the light-emitting chip. Namely, since the conductive wire is arranged so as not to cross the sidewall of the LED chip, it is now possible to prevent the optical output from being deteriorated and hence to derive a high optical output.

When the thickness of the fluorescent layer disposed on the LED chip as well as the concentration of fluorescent substance is confined within a specific range, it is possible to further enhance the optical output. As described above, when the concentration of the fluorescent substance in the fluorescent layer is confined to range from 40 to 60 wt %, fine recessed/projected portions reflecting the configuration of fluorescent substance would be formed on the surface of fluorescent layer. Due to this recessed/projected portions, the light is enabled to effectively diffuse into the interface between the fluorescent layer and the external atmosphere. As a result, it is now possible to prevent the discoloration of luminescent color and to secure a uniform emission of light.

The light-emitting device according to this embodiment of the present invention can be manufactured by the following process.

First of all, a package cup provided, at the bottom thereof, with positive and negative electrodes each capable of electrically connecting with an external member is prepared. Then, a semiconductor light-emitting element such as an LED chip having an electrode pad on the top surface thereof is mounted on the package cup according to the conventional method. In the step of wire bonding, one end of a conductive wire is bonded at first to the lead electrode formed on the bottom of the package cup. Thereafter, an intermediate portion of the conductive wire is arranged to pass along a ridge elevationally defining a boundary between neighboring sidewalls of the light-emitting chip and to pass over one of the corners of polygonal top surface of the LED chip. Ultimately, the other end of the conductive wire is bonded to an electrode pad formed on the top surface of the LED chip.

On the other hand, a fluorescent substance having a particle diameter ranging from 20 to 75 μm is dispersed at a predetermined concentration in the material of light-transmitting member such as silicone resin and epoxy resin, thereby preparing a raw material for the fluorescent layer. The particle diameter of the fluorescent substance is adjusted in advance so as to fall within a predetermined range by classification. The concentration of the fluorescent substance in the raw material for the fluorescent layer is confined within the range of 40 to 60 wt %.

Subsequently, the raw material for the fluorescent layer is heated and dropped over the top surface of the LED chip mounted on the package cup by using a dispenser, thereby forming a coated film.

The heating temperature can be suitably selected depending on the curing temperature of the light-transmitting member. This heating step is continued until at least the raw material for the fluorescent layer is heated up to the curing temperature thereof. For example, when silicone resin is employed as a material for the light-transmitting member, the raw material for the fluorescent layer should preferably be heated up to 150° C. or more.

In the step of coating the raw material for the fluorescent layer, the quantity of the raw material is adjusted enabling the raw material to be dropped little by little so as to control the thickness of the fluorescent layer after the curing thereof to range from 80 to 240 um. Since the specific gravity of fluorescent substance is larger than that of the light-transmitting member such as a liquid resin, the fluorescent substance tends to aggregate and sediment. Therefore, in order to prevent the sedimentation of fluorescent substance and to obtain a fluorescent layer where the fluorescent substance is uniformly dispersed therein, the quantity of raw material for the fluorescent layer to be dropped should desirably be as minimum as possible.

Subsequently, the resultant package cup is placed in an oven for example and the light-tansmitting member is heated and cured for 30 minutes to 3 hours at a temperature of 80-200° C. If the fluorescent substance flocculates around the LED chip, the optical output would deteriorate. Therefore, in order to prevent the flocculation, the light-transmitting member is required to be cured immediately after the dropping of the raw material. When the light-transmitting member is cured in this manner, it is possible to form a fluorescent layer wherein a fluorescent substance is dispersed around the LED chip without causing the particles of fluorescent substance to superimpose with each other, thus preventing the optical output from being deteriorated.

The conditions for the heat curing of the light-transmitting member can be suitably selected depending on the heat curing temperature of the light-transmitting member. For example, when silicone resin is employed as a light-transmitting member, it can be cured by heating it for 30 minutes to 3 hours at a temperature of 80-200° C.

In this manner, it is possible to obtain a light-transmitting device according to this embodiment of the present invention.

Next, specific examples of the present invention will be described as follows.

EXAMPLE 1

First of all, an LED chip was formed of a lamination consisting of a universal n-type electrode layer, a SiC layer, a light-emitting layer formed of a nitride semiconductor ($Al_xGa_yIn_zN$; $0 \leq x \leq 1$, $0 \leq y \leq 1$, $0 \leq z \leq 1$, $x+y+z=1$), and a p-type electrode layer, thereby enabling the LED chip to emit a light of blue region. This LED chip was featured in that it had a SiC substrate, a rectangular top surface and a bottom having a size of 300 μm×300 μm. The LED chip is provided, at a central region of the top surface thereof which was 200 μm×200 μm in size, with an electrode pad made of AuSn and having a diameter of about 100 μm.

This LED chip was then mounted on a package cup provided, on the bottom thereof, with lead electrodes formed of gold-plated copper plate. One end of a gold wire was then bonded to one of the lead electrodes. Then, an intermediate portion of the gold wire was arranged to pass along a ridge elevationally defining a boundary between neighboring sidewalls of the LED chip and to pass over one of the corners of rectangular top surface of the LED chip. The other end of the gold wire was then bonded to the electrode pad formed on the top surface of the LED chip, thus electrically connecting the electrode pad with the lead electrode.

On the other hand, a yellow fluorescent substance having a composition represented by $(Sr_{1.84}Ba_{0.12})SiO_4$:Eu was prepared as a fluorescent substance. As for the raw material for the light-transmitting member, silicone resin was prepared. The diameter of the fluorescent substance employed herein was confined to the range of 20 to 45 μm. The range of 20 to 45 μm in particle diameter in this case means that the particle diameter of fluorescent particles occupying not less than ⅓ of a total number of fluorescent particles existing in an area of 0.04 mm² is distributed within the range of 20 to 45 μm as the fluorescent layer is observed by using a microscope. This fluorescent substance was dispersed in the silicone resin at a concentration of 50 wt %, thus obtaining a raw material for the fluorescent layer.

The raw material for the fluorescent layer was then coated on the LED chip by using a dispenser. Then, the package cup was immediately placed in an oven and left therein for three hours at a temperature of 150° C., thus accomplishing the light-emitting device of this example. When a section of the light-emitting device thus obtained was observed by a microscope, the top surface and sidewalls of the LED chip as well as the bottom of the package cup was found entirely covered by the fluorescent layer having a uniform thickness of 100 μm.

Figure 3:
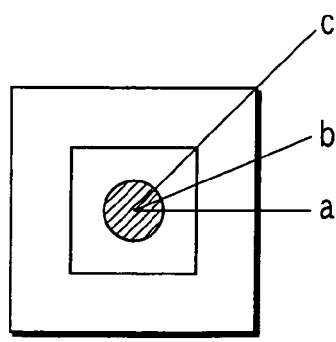
FIG. 3 is a plan view schematically illustrating the direction of the conductive wire.

For the purpose of comparison, various kinds of light-emitting devices were manufactured in the same manner as described above except that the direction (angle) of the conductive wire was altered. More specifically, as shown in FIG. 3, the direction of the wire was arranged so as to orthogonally intersect with one of sidewalls of the light-emitting chip (i.e. the angle of the wire was 0°) in one example (a). The direction of the wire was arranged so as to pass over one of corners of the light-emitting chip as described above (i.e. the angle of the wire was 45°) in another example (c). The direction of the wire was arranged so as to pass through a middle point between (a) and (c) in a further example (b).

Figure 4:
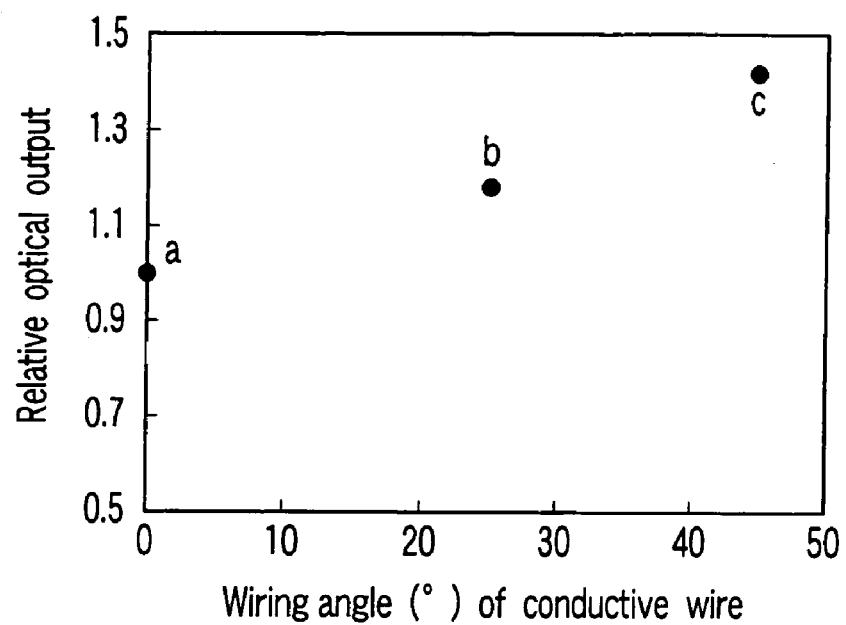
FIG. 4 is a graph illustrating the relationship between the wiring angle of conductive wire and optical output in Example 1.

Then, the optical output of each of these light-emitting devices was measured by a light flux measuring apparatus, the results being shown in the graph of FIG. 4. As shown in FIG. 4, in the case of example (c) where the direction of the wire was arranged so as to pass over one of corners of the top surface of the light-emitting chip, the optical output was increased about 1.4 times as high as that of the example (a) where the wire was arranged so as to orthogonally intersect with one of sidewalls of the light-emitting chip. It was confirmed that by arranging the conductive wire so as not to intersect the sidewall of the LED chip, it was possible to enhance the optical output. Incidentally, the optical output that could be derived as the wiring angle of the conductive wire was set to 0° was defined as being 1.

Figure 5:
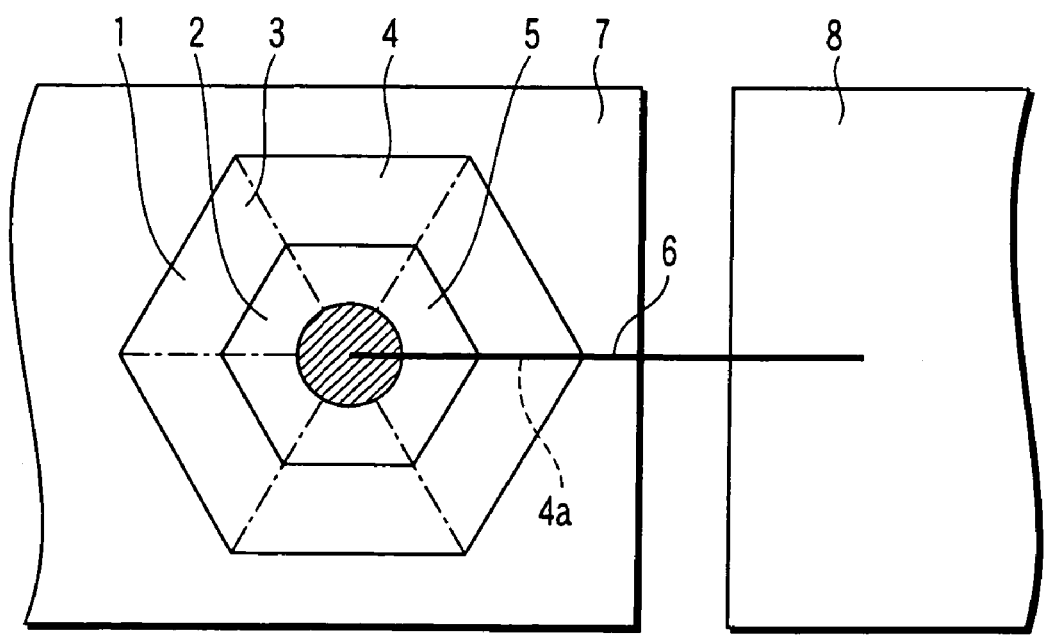
FIG. 5 is a plan view schematically illustrating a top surface of part of the light-emitting device according to another embodiment of the present invention.

As for the configuration of the LED chip, it may be hexagonal. A top plan view of such a hexagonal light-emitting device is shown in FIG. 5. The structure of the light-emitting device shown in FIG. 5 is the same as that shown in FIG. 2 except that the LED chip 1 is hexagonal. As shown in FIG. 5, the conductive wire 6 is arranged to pass over one of corners of the hexagonal top surface of the LED chip 1 and along a ridge 4a formed contiguous with the one of corners and elevationally defining a boundary between neighboring sidewalls of the LED chip 1, thereby connecting the electrode pad 5 with the lead electrode 8. When the top surface of the LED chip is hexagonal, the direction of wiring is increased by two directions as compared with that of the rectangular LED chip, thereby facilitating the operation of wire bonding. Furthermore, since the pattern of emission of LED chip would become more close to a circle, the directivity of light would be enhanced.

EXAMPLE 2

Figure 6:
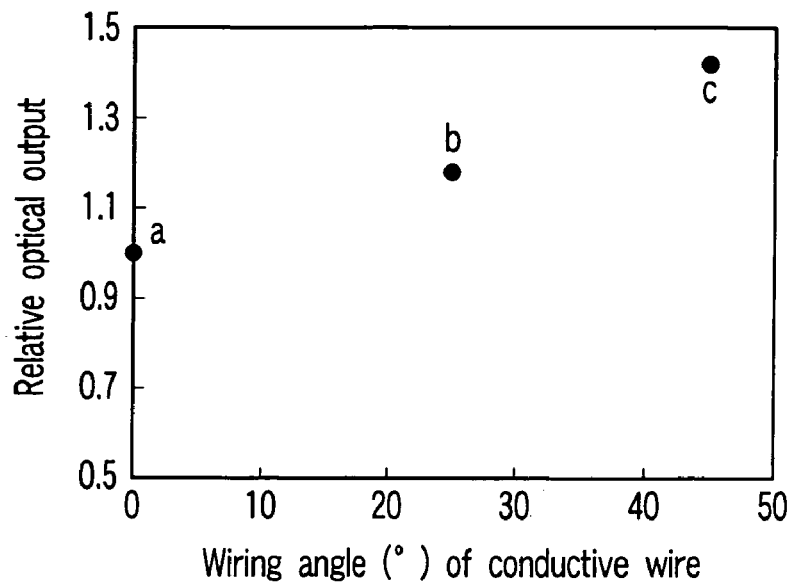
FIG. 6 is a graph illustrating the relationship between the wiring angle of conductive wire and optical output in Example 2.

A light-emitting device was manufactured in the same manner as in Example 1 except that the fluorescent substance was changed to $(Y, Gd)_3(Al, Gd)_5O_{12}:Ce$. Then, the optical output of the light-emitting device was investigated, the results being illustrated in the graph of FIG. 6. As shown in FIG. 6, in the case of example (c) where the direction of the wire was arranged so as to pass over one of corners of the top surface of the light-emitting chip, the optical output was increased about 1.4 times as high as that of the example (a) where the wire was arranged so as to orthogonally intersect with one of sidewalls of the light-emitting chip.

Incidentally, it should be noted that the present invention is not confined to the aforementioned examples. For example, although a SiC substrate was employed as a semiconductor substrate in the foregoing examples, it is also possible to employ other kinds of semiconductor substrates such as a GaN substrate. It may be constructed such that an electrode is provided on each of the opposite surfaces of the semiconductor substrate and an electric current is passed between the electrodes. For example, it is possible to employ an LED chip formed of a nitride semiconductor which has been grown on an n-type GaN substrate.

Figure 7:
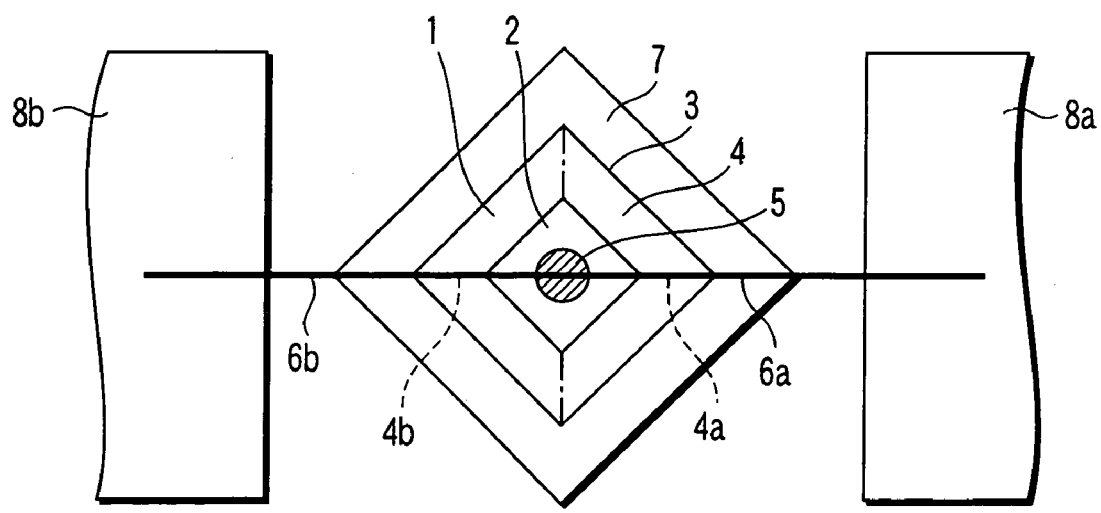
FIG. 7 is a plan view schematically illustrating a top surface of part of the light-emitting device according to a further embodiment of the present invention.

Further, as shown in FIG. 7, a plurality of lead electrodes 8a, 8b may be formed on the bottom of the package cup and these lead electrodes 8a, 8b may be connected with the electrode pad 5 provided on the top surface of the LED chip 1 by using conductive wires 6a, 6b. In this structure also, each of these conductive wires 6a, 6b is arranged to pass along the ridges 4a, 4b elevationally defining a boundary between neighboring sidewalls of the LED chip 1 without laterally crossing the sidewall of the LED chip 1. In FIG. 7, a couple of conductive wires 6a, 6b are provided so as to pass over a couple of corners lying on a diagonal line of the top surface of LED chip 1. The conductive wire may be arranged so as to pass along every one of the ridges (four ridges in FIG. 7) elevationally defining a boundary between neighboring sidewalls of the LED chip 1 or may be arranged to pass along only some of the ridges as shown in FIG. 7.

The present invention should not be construed as being limited by the aforementioned embodiments. Namely, the constituent elements can be modified in the practice of the invention without departing from the spirit of the invention. Further, a plurality of constituent elements disclosed in the foregoing embodiments may be optionally combined, thereby creating various inventions. For example, some of constituent elements may be omitted from the entire constituent elements employed in the foregoing embodiments. Moreover, the constituent elements employed in different embodiments may be optionally combined.

According to the present invention, it is possible to provide a light-emitting device which is capable of emitting light at a high optical output without accompanying discoloration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emitting device comprising:
   a supporting member;
   a light-emitting element disposed on the supporting member to emit a light, the light-emitting element having a semiconductor substrate and a rectangular top surface;
   an electrode pad formed on the top surface of the light-emitting element;
   a first lead electrode formed on the supporting member;
   a conductive wire connecting the electrode pad with the first lead electrode, the conductive wire being arranged to pass over one of corners of the rectangular top surface of the light-emitting element and contacting along a ridge formed contiguous to the one of corners and corresponding to a boundary between neighboring side surfaces of the light-emitting element; and
   a fluorescent layer containing a light-transmitting member and a fluorescent substance.

2. The light-emitting device according to claim 1, wherein the semiconductor substrate is formed of SiC or GaN.

3. The light-emitting device according to claim 1, wherein the fluorescent layer has a thickness ranging from 80 to 240 μm and is extended covering the light-emitting element.

4. The light-emitting device according to claim 1, wherein the fluorescent layer contains the fluorescent substance at a concentration ranging from 40 to 60 wt %.

5. The light-emitting device according to claim 1, wherein the fluorescent layer has a recessed/projected surface reflecting the configuration of the fluorescent substance.

6. The light-emitting device according to claim 1, wherein the fluorescent substance has a particle diameter ranging from 20 to 75 μm.

7. The light-emitting device according to claim 1, wherein the fluorescent substance in the fluorescent layer is YAG fluorescent substance.

8. The light-emitting device according to claim 1, wherein the fluorescent substance in the fluorescent layer is a silicate fluorescent substance.

9. The light-emitting device according to claim 1, further comprising a second lead electrode between the semiconductor substrate and the supporting member.

10. The light-emitting device according to claim 1, wherein the conductive wire has a diameter ranging from 10 to 45 μm.

11. A light-emitting device comprising:
    a supporting member;
    a light-emitting element disposed on the supporting member to emit a light, the light-emitting element comprising a semiconductor substrate and having a configuration including a top surface and a bottom surface and at least three oblique side surfaces;
    an electrode pad formed on a top surface of the light-emitting element;

a first lead electrode formed on the supporting member;
a conductive wire connecting the electrode pad with the first lead electrode, the conductive wire being arranged to pass over one of corners of the top surface of the light-emitting element and contacting along a ridge formed contiguous to the one of corners and corresponding to a boundary between neighboring side surfaces of the light-emitting element; and
a fluorescent layer containing a light-transmitting member and a fluorescent substance.

12. The light-emitting device according to claim 11, wherein the semiconductor substrate is formed of SiC or GaN.

13. The light-emitting device according to claim 11, wherein the fluorescent layer has a thickness ranging from 80 to 240 μm and is extended covering the light-emitting element.

14. The light-emitting device according to claim 11, wherein the fluorescent layer contains the fluorescent substance at a concentration ranging from 40 to 60 wt %.

15. The light-emitting device according to claim 11, wherein the fluorescent layer has a recessed/projected surface reflecting the configuration of the fluorescent substance.

16. The light-emitting device according to claim 11, wherein the fluorescent substance has a particle diameter ranging from 20 to 75 μm.

17. The light-emitting device according to claim 11, wherein the fluorescent substance in the fluorescent layer is YAG fluorescent substance.

18. The light-emitting device according to claim 11, wherein the fluorescent substance in the fluorescent layer is a silicate fluorescent substance.

19. The light-emitting device according to claim 11, further comprising a second lead electrode between the semiconductor substrate and the supporting member.

20. The light-emitting device according to claim 11, wherein the conductive wire has a diameter ranging from 10 to 45 μm.

* * * * *